US008436981B2

(12) United States Patent
Ebihara

(10) Patent No.: US 8,436,981 B2
(45) Date of Patent: May 7, 2013

(54) EXPOSING METHOD, EXPOSURE APPARATUS, AND DEVICE FABRICATING METHOD

(75) Inventor: Akimitsu Ebihara, Sennan-gun (JP)

(73) Assignee: Nikon Corporation, Tokyo (JP)

(*) Notice: Subject to any disclaimer, the term of this patent is extended or adjusted under 35 U.S.C. 154(b) by 763 days.

(21) Appl. No.: 12/318,761

(22) Filed: Jan. 8, 2009

(65) Prior Publication Data

US 2009/0268177 A1 Oct. 29, 2009

Related U.S. Application Data

(60) Provisional application No. 61/006,761, filed on Jan. 30, 2008.

(30) Foreign Application Priority Data

Jan. 10, 2008 (JP) ................................. 2008-003740

(51) Int. Cl.
*G03B 27/54* (2006.01)
(52) U.S. Cl.
USPC .............................................. 355/67; 355/53
(58) Field of Classification Search ..................... 355/53, 355/67
See application file for complete search history.

(56) References Cited

U.S. PATENT DOCUMENTS

| 4,688,932 | A | 8/1987 | Suzuki |
| 5,194,893 | A | 3/1993 | Nishi |
| 5,238,870 | A | 8/1993 | Tanaka |
| 6,753,943 | B2 | 6/2004 | Tsuji et al. |
| 2003/0231290 | A1* | 12/2003 | Tsujikawa et al. ............... 355/53 |
| 2004/0233407 | A1* | 11/2004 | Nishi et al. ....................... 355/53 |
| 2005/0200823 | A1* | 9/2005 | Tokuda et al. .................. 355/69 |

FOREIGN PATENT DOCUMENTS

| JP | A-61-232615 | 10/1986 |
| JP | A-04-215417 | 8/1992 |
| JP | A-4-277612 | 10/1992 |
| JP | A-10-41215 | 2/1998 |
| JP | A-2000-3874 | 1/2000 |
| JP | A-2004-153096 | 5/2004 |
| WO | WO 99/49504 A1 | 9/1999 |
| WO | WO 2004/019128 A2 | 3/2004 |

OTHER PUBLICATIONS

International Search Report issued in InternationalPatent Application No. PCT/ JP2009/ 050053; mailed Apr. 21, 2009; with English language translation.
Written Opinion issued in International Patent Application No. PCT/ JP2009/ 050053; mailed Apr. 21, 2009; with English language translation.

* cited by examiner

*Primary Examiner* — Hung Henry Nguyen
*Assistant Examiner* — Mesfin T Asfaw
(74) *Attorney, Agent, or Firm* — Oliff & Berridge, PLC

(57) ABSTRACT

An exposing method that forms a pattern of a reticle on a wafer is provided. In the method, part of the pattern of the reticle in an illumination area, which is illuminated by illumination light from an illumination optical system, is illuminated, and while scanning the illumination area with respect to the reticle in the +Y direction (or the −Y direction) by pivoting a deflection mirror, the reticle is moved in the corresponding −Y direction (or the +Y direction) and the wafer is moved in a direction that corresponds to the movement direction of the reticle.

27 Claims, 7 Drawing Sheets

EXPOSING METHOD, EXPOSURE APPARATUS, AND DEVICE FABRICATING METHOD

CROSS-REFERENCE TO RELATED APPLICATION

This application is a non-provisional application claiming priority to and the benefit of U.S. provisional application No. 61/006,761, filed Jan. 30, 2008, and claims priority to Japanese Patent Application No. 2008-003740, filed Jan. 10, 2008. The entire contents of which are incorporated herein by reference.

BACKGROUND

1. Field of the Invention

The present invention relates to an exposure technique that forms a pattern, which corresponds to a pattern formed in a mask, on an object and to a device fabrication technique that uses the exposure technique.

2. Related Art

Lithographic processes for fabricating devices (i.e., electronic devices and microdevices), such as semiconductor integrated circuits and liquid crystal display devices, conventionally use a full-field exposure type projection exposure apparatus, such as a stepper, to transfer a pattern formed in a reticle (or a photomask and the like) to each shot region on a wafer (or a glass plate and the like), which is coated with a resist, through a projection optical system.

To transfer the patterns of ever larger devices onto wafers without increasing the size of the projection optical system, scanning exposure type projection exposure apparatuses (scanning type exposure apparatuses), such as scanning steppers (scanners), have also been used in recent years (e.g., see Japanese Unexamined Patent Application Publication No. H04-277612); these projection exposure apparatuses scan the reticle and the wafer with respect to the projection optical system during the exposure using the projection magnification as a velocity ratio. In addition, to correct image forming characteristics, such as the field curvature of the projection optical system, an exposure apparatus is also known in the art (e.g., see Japanese Unexamined Patent Application Publication No. S61-232615) that simultaneously scans a pattern surface of a stationary reticle with a slit shaped illumination area and controls the positions (heights) of the reticle and the wafer in the optical axis direction of the projection optical system in accordance with the position of the illumination area.

To increase throughput in a scanning type exposure apparatus, it is necessary to increase the scanning velocities of the stages. Nevertheless, in a scanning type exposure apparatus, simply increasing the scanning velocities of the stages risks an increase in the size and complexity of the stage mechanisms, an increase in the magnitude of vibrations of the stages during the scanning exposure, and, as a result, a decrease in overlay accuracy and the like. In addition, during a regular scanning exposure, it is necessary to preserve a settling distance and a settling interval for each stage (the reticle stage and the wafer stage) that enable it to reach its constant velocity as determined by the projection magnification ratio. However, simply increasing the respective scanning velocities risks an increase in the respective settling distances and settling intervals, and consequently risks an increase in the exposure time.

In addition, a conventional exposure apparatus that controls the heights of the reticle and the wafer in accordance with the position of the illumination area does not particularly address ways to reduce the exposure time and thereby increase throughput.

A purpose of some aspect of the present invention is to provide an exposure technology that can improve the throughput of an exposing process without increasing the velocities of the stages, and a device fabrication technology that uses the exposure technology.

SUMMARY

A first aspect of the present invention provides an exposing method that forms a pattern corresponding to a pattern formed in a mask on an object, comprising: illuminating part of the pattern formed in the mask in an illumination area of a prescribed shape; and while scanning the illumination area with respect to the mask in a prescribed direction, moving the mask in a direction that corresponds to the prescribed direction and moving the object in a direction that corresponds to the movement direction of the mask.

A second aspect of the present invention provides an exposure apparatus that forms a pattern corresponding a pattern formed in a mask on an object, comprising: an illumination optical system that illuminates part of the pattern formed in the mask in an illumination area of a prescribed shape; an illumination area scanning mechanism that scans the illumination area with respect to the mask in a prescribed direction; and a control apparatus that, while scanning the illumination area with respect to the mask in the prescribed direction, moves the mask in a direction corresponding to the prescribed direction and moves the object in a direction corresponding to a movement direction of the mask.

A third aspect of the present invention provides an exposing method that forms a pattern corresponding a pattern formed in a mask on an object, comprising: illuminating part of the pattern formed in the mask in an illumination area of a prescribed shape; scanning the illumination area with respect to the mask in a prescribed direction; and based on a formation condition of the pattern, controlling the scanning velocity of the illumination area with respect to the mask.

A fourth aspect of the present invention provides an exposure apparatus that forms a pattern corresponding a pattern formed in a mask on an object, comprising: an illumination optical system that illuminates part of the pattern formed in the mask in an illumination area of a prescribed shape; an illumination area scanning mechanism that scans the illumination area with respect to the mask in a prescribed direction; and a control apparatus that controls a scanning velocity of the illumination area with respect to the mask based on formation conditions of the pattern.

A fifth aspect of the present invention provides a device fabricating method comprising: exposing a substrate using an exposure method or an exposure apparatus according to the above-described aspects; and processing the exposed substrate.

According to the first and second aspects of the present invention, in addition to the mask and the object being moved, the illumination area is scanned. Accordingly, it is possible to reduce the amount of time needed for a single scanning exposure without increasing the velocities of the mask and the object, which are moved by the respective stages, and thereby to improve the throughput of the exposing process.

According to the third and fourth aspects of the present invention, the scanning velocity of the illumination area with respect to the mask is controlled based on a formation condition of the pattern. Accordingly, by increasing the scanning velocity of the illumination area with virtually no movement of the mask and the object by the stages, it is possible to improve the throughput of the exposing process.

DESCRIPTION OF EMBODIMENTS

First Embodiment

The following text explains a first preferred embodiment 1 of the present invention, referencing FIG. 1 through FIG. 4D.

Figure 1:
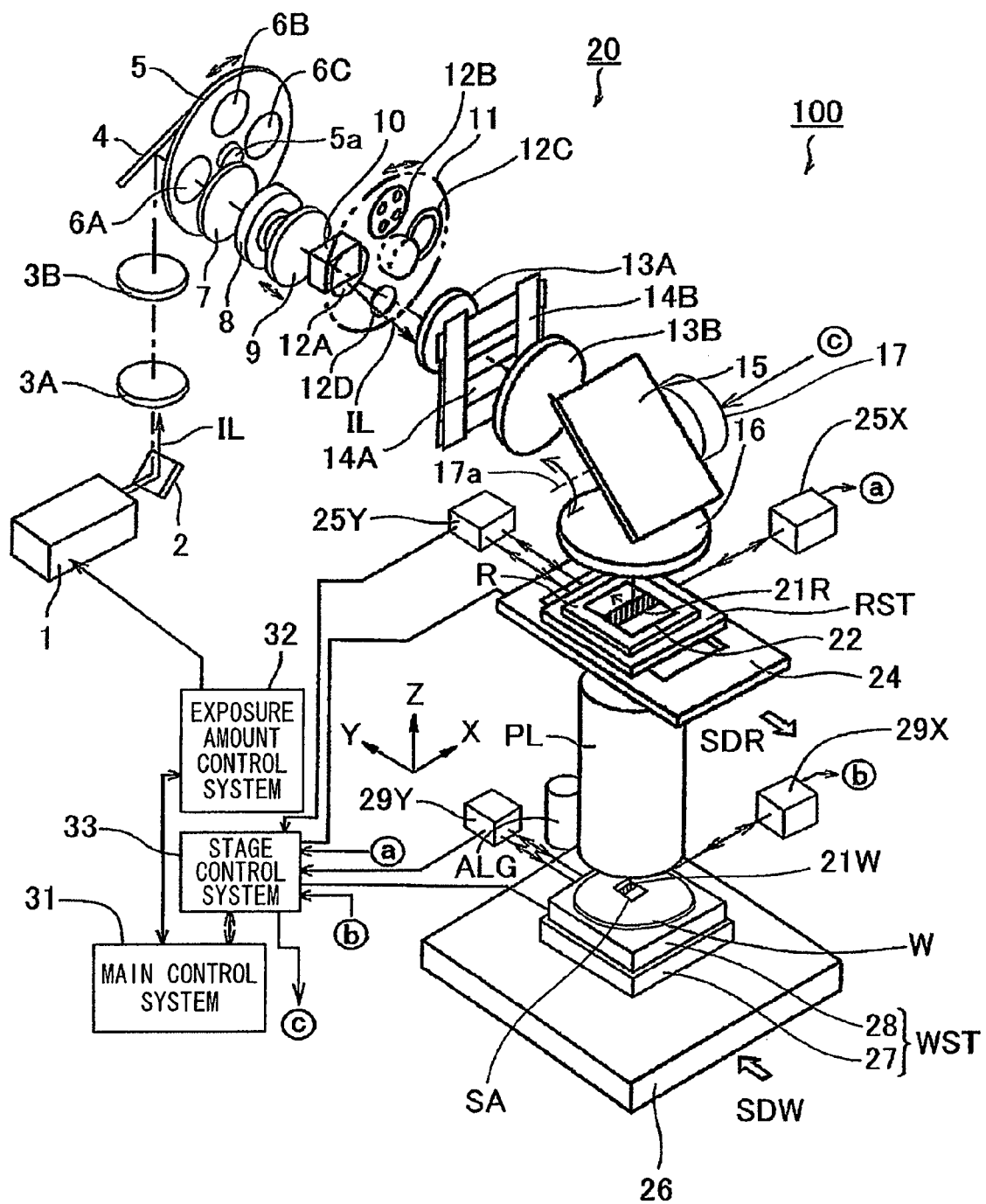
FIG. 1 is an oblique view that shows a schematic configuration of an exposure apparatus according to a first embodiment of the present invention.

FIG. 1 shows a schematic configuration of a scanning exposure type exposure apparatus (projection exposure apparatus) 100, such as a scanning stepper (scanner), according to the present embodiment. In FIG. 1, the exposure apparatus 100 comprises: a light source 1 for exposure; an illumination optical system 20 that uses exposure illumination light (exposure light) IL from the light source 1 to illuminate an illumination area 21R of a reticle (mask) R wherein a pattern to be transferred is formed; and a reticle stage RST that drives the reticle R. The exposure apparatus 100 further comprises: a projection optical system PL that projects an image of the pattern within the illumination area 21R of the reticle R onto a wafer (object) W; a wafer stage WST that drives the wafer W; a main control system 31 comprising a computer that provides supervisory control of the operation of the entire apparatus; an exposure amount control system 32; a stage control system 33; other processing systems and the like; and a frame (not shown) that supports these members. In the explanation below, the Z axis is parallel to an optical axis AX (refer to FIG. 2A) of the projection optical system PL, the Y axis is oriented in scanning direction of the reticle R and the wafer W when a scanning exposure is performed and within a plane perpendicular to the Z axis, and the X axis is oriented in non-scanning direction that are orthogonal to the scanning direction. In addition, the rotational directions around the X axis, the Y axis, and the Z axis are called the θX direction, the θY direction, and the θZ direction, respectively.

An ArF excimer laser light source (with a wavelength of 193 nm) is used as the light source 1. Furthermore, an ultraviolet pulsed laser light source such as a KrF excimer laser (wavelength: 248 μm) or an $F_2$ laser (wavelength: 157 nm), a harmonic generating light source such as a YAG laser, a harmonic generation apparatus such as a solid state laser (e.g., a semiconductor laser), or a mercury lamp (e.g., i-line) can also be used as the exposure light source. Based on control information (for example, the appropriate amount of exposure, namely, the sensitivity, of a resist on the wafer W and the scanning velocity of the stages) from the main control system 31 and a detection signal of an integrator sensor (not shown), which is a photoelectric sensor that monitors the luminous flux intensity (pulse energy×frequency) of the illumination light IL within the illumination optical system 20, the exposure amount control system 32 controls the oscillation frequency, the average pulse energy, the light emitting timing, and the like of the light source 1 so that the wafer W receives the appropriate amount of exposure.

In the illumination optical system 20, the illumination light IL emerges from the light source 1, travels via a mirror 2, and is shaped by lenses 3A, 3B so that its cross sectional shape forms a prescribed shape; subsequently, the illumination light IL travels via a mirror 4, impinges a diffractive optical element 6A, which is fixed to a revolver 5, and is then diffracted in a plurality of directions so that a prescribed light distribution (e.g., circular distribution) is obtained at a pupillary plane 18 (refer to FIG. 2A) of the illumination optical system 20. Diffractive optical elements 6B, 6C, each of which has different diffraction characteristics, are also affixed to the revolver 5.

For example, the illumination light IL impinged on the diffractive optical element 6B is diffracted so as to obtain an annular distribution as the prescribed light distribution. Furthermore, the illumination light IL impinged on the diffractive optical element 6C is diffracted so as to obtain a bipolar distribution or a quadrupole distribution as the prescribed light distribution. By controlling the rotational angle of the revolver 5 via a drive part 5a, any of the diffractive optical elements 6A, 6B, 6C can be set along the optical path of the illumination light IL in accordance with set illumination conditions.

In FIG. 1, the illumination light IL that passes through the diffractive optical element 6A is condensed by a relay lens 7 (which may be a zoom lens), passes through an axicon system that comprises a pair of prisms 8, 9, and is condensed to an incident surface of a fly-eye lens 10, which serves as an optical integrator. An emergent surface of the fly-eye lens 10 is a pupillary plane of the illumination optical system 20. In addition, by controlling the spacing between the prisms 8, 9, it is possible to adjust the light distribution at the emergent surface in the radial directions and to adjust the coherence factor (σ value). Furthermore, an aperture stop plate 11, wherein aperture stops 12A, 12B, 12C, 12D, and the like are formed, may be disposed in the vicinity of the fly-eye lens 10; furthermore. In addition, instead of the fly-eye lens 10, for example, a micro fly-eye with a greater wavefront split count may be used.

The illumination light IL that passes through the fly-eye lens 10 travels via a relay lens 13A and sequentially travels through a fixed blind 14A (fixed field stop), which defines the shape of the illumination area 21R on the reticle R, and a movable blind 14B (movable field stop), which controls the width of the illumination area 21R both in the scanning direction and in the non-scanning direction orthogonal thereto. The movable blind 14B is disposed in a plane that is substantially conjugate with the pattern surface (reticle surface) of the reticle R, and the fixed blind 14A is disposed in a plane that is slightly defocused from the plane conjugate with the reticle surface. After the illumination light IL passes through the blinds 14A, 14B, it travels via a first condenser lens 13B, a pivotable deflecting mirror 15 that folds the optical path, and a second condenser lens 16 and then illuminates the illumination area 21R within a pattern area 22 of the reticle R with a uniform luminous flux intensity distribution. The members extending from the lenses 3A, 3B to the second condenser lens 16 constitute the illumination optical system 20. The shape of the illumination area 21R (the shape when the movable blind 14B is open) is a rectangle that is long and thin in the non-scanning directions (the X directions). Furthermore, the shape of the illumination area 21R may be, for example, arcuate with a constant width in the Y directions.

In the present embodiment of FIG. 1, the center of the deflecting mirror 15 is positioned in a plane that is conjugate with the papillary plane of the illumination optical system 20. In addition, the deflecting mirror 15 is pivotally supported via a holding member (not shown) around an axis 17a, which passes through an optical axis of the illumination optical system 20 and is parallel to the X axis (i.e., parallel to the non-scanning direction). A reference angle of the deflecting mirror 15 is defined as a state wherein the deflecting mirror 15 is inclined by 45° with respect to the optical axis of the illumination optical system 20. A drive part 17, which comprises a motor for rotating the deflecting mirror 15 at a constant angular velocity either clockwise or counterclockwise around the axis 17a within a prescribed angular range with the reference angle at the center of the range, is fixed to the frame (not shown). The stage control system 33 controls the inclination angle and the rotational velocity of the deflecting mirror 15 via the drive part 17 in accordance with the position and the velocity of the reticle stage RST (or the wafer stage WST) during a scanning exposure.

Furthermore, instead of the deflecting mirror 15, it is also possible to use a digital micromirror device, wherein numerous micromirrors are arrayed in a plane. If a digital micromirror device is used, then the stage control system 33 should control the inclination angle and the inclinational (rotational) velocity of each of the micromirrors in accordance with the position and the velocity of the reticle stage RST (or the wafer stage WST).

In addition, the second condenser lens 16 in the illumination optical system 20 is a lens system with an f·θ characteristic wherein the angle of the incident light in at least the Y directions (scanning directions) and the position of the emergent light in the Y directions are proportional. The second condenser lens 16 may be configured by combining, for example, a plurality of cylindrical lenses that have refractive power in the Y directions and a plurality of cylindrical lenses that have refractive power in the X directions. Furthermore, an f·θ lens that has the f·θ characteristic in all directions may be used as the second condenser lens 16.

Thus, by combining the deflecting mirror 15, which is pivoted by the drive part 17, and the second condenser lens 16, which has the f·θ characteristic in the Y directions, it is possible to scan the illumination area 21R on the reticle surface at a specified constant velocity and with a prescribed stroke in the +Y and −Y directions, which are the short side direction of the illumination area 21R. During the scanning, the stroke of the illumination area 21R in the Y directions covers, for example, a range defined so that at least part of the illumination area 21R lies within an effective field PLef (refer to FIG. 3A) on the object side of the projection optical system PL.

In addition, during an actual scanning exposure, the relative velocity of the illumination area 21R with respect to the reticle stage (reticle R) RST in the Y directions should be fixed. Consequently, it is also possible to perform an exposure wherein the relative velocity is fixed by, for example, increasing and decreasing the scanning velocity of the illumination area 21R when accelerating and decelerating the reticle stage RST (and the wafer stage WST) at the start and end times of the scanning exposure, respectively. Accordingly, the scanning velocity of the illumination area 21R can be controlled during the scanning exposure as well.

In addition, it is also possible to use a regular lens (i.e., a lens that has the so-called f·θ characteristic) as the second condenser lens 16; in such a case, the rotational velocity of the deflecting mirror 15 should be controlled so that the scanning velocity of the illumination area 21R varies according to a fixed or prescribed characteristic.

In FIG. 1, using the illumination light IL, the pattern within the illumination area 21R on the pattern surface (i.e., the object plane) of the reticle R is projected to an exposure area 21W (an area conjugate with the illumination area 21R), which is long and thin in the non-scanning direction, on one shot region SA of the front surface of the wafer W (i.e., the image plane) through the projection optical system PL, which is double telecentric (or object-space telecentric), with a projection magnification β (wherein β is a reduction magnification of, for example, ¼, ⅕, or the like). The wafer W is a discoidal base material that comprises a semiconductor, such as silicon or silicon-on-insulator (SOI), and whose front surface is coated with a resist (photosensitive material). The projection optical system PL is, for example, a dioptric system, but it may be a catadioptric system or the like.

In addition, because the projection optical system PL forms an image that is inverted in the Y directions, the scanning directions (i.e., the −Y and +Y directions) of the wafer W are the reverse of the scanning directions (i.e., the +Y and −Y directions) of the reticle R during a scanning exposure. Furthermore, an optical system that forms an erect image in the Y directions can also be used as the projection optical system PL. In such a case, the scanning direction of the reticle R and the wafer W during a scanning exposure are the same.

Next, the reticle R is chucked onto the reticle stage RST, the reticle stage RST moves on a reticle base 24 at a fixed velocity in the Y directions while also finely moving in the X directions, the Y directions, and the θZ direction so as to correct, for example, synchronization error (or the amount of positional deviation between the pattern image of the reticle R and the shot region on the wafer W during the exposure), and thereby the reticle R is scanned. Laser interferometers 25X, 25Y measure the positions of the reticle stage RST in at least the X and Y directions with a resolving power of approximately 0.5-0.1 nm using, for example, the projection optical system PL as a reference, measure the rotational angle of the reticle stage RST in the θZ direction, and supply the measurement values to the stage control system 33 and the main control system 31. Based on these measurement values and the control information supplied from the main control system 31, the stage control system 33 controls the position and the velocity of the reticle stage RST via a drive mechanism (e.g., a linear motor), which is not shown.

In FIG. 1, the wafer W is held on the wafer stage WST via a wafer holder (not shown); furthermore, the wafer stage WST comprises an XY stage 27, which moves on a wafer base 26 in the Y directions at a fixed velocity and steps in the X and Y directions, and a Z tilt stage 28. Based on the measurement value of the position of the wafer W in the Z directions provided by an auto focus sensor (not shown), the Z tilt stage 28 performs a focusing and leveling operation on the wafer W. With a positional resolving power of approximately 0.5-0.1 nm, laser interferometers 29X, 29Y measure, for example, the position of the wafer stage WST in the X and Y directions and the rotational angle of the wafer stage WST in the θX direction, the θY direction, and the θZ direction. Based on these measurement values and control information supplied by the main control system 31, the stage control system 33 controls the operation of the wafer stage WST via a drive mechanism (i.e., a linear motor or the like), which is not shown.

In addition, an off axis type alignment sensor ALG for measuring alignment marks on the wafer W is disposed on a side surface of the projection optical system PL, and, based on the detection result thereof, the main control system 31 aligns the wafer W. Furthermore, to align the reticle R, a reticle alignment system (not shown) that detects the positions of alignment marks of the reticle R is also provided.

Figure 2A:
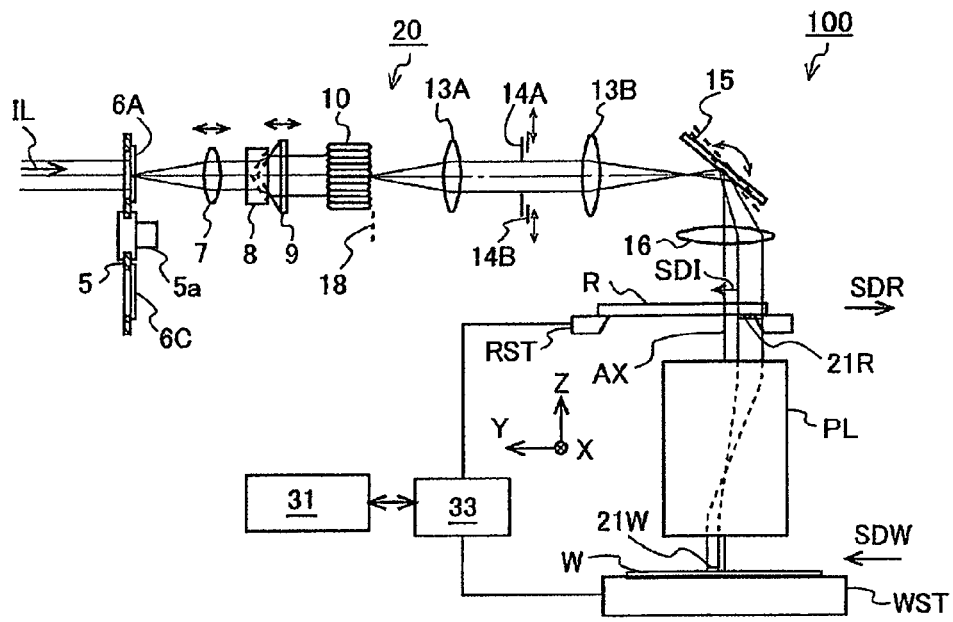
FIG. 2A shows changes in the positional relationships among an illumination area 21R, a reticle stage RST, and a wafer stage WST in FIG. 1 when a scanning exposure is performed.
Figure 2B:
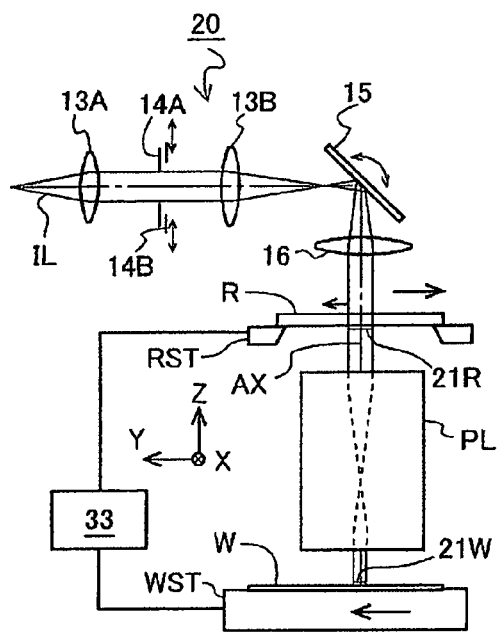
FIG. 2B shows changes in the positional relationships among an illumination area 21R, a reticle stage RST, and a wafer stage WST in FIG. 1 when a scanning exposure is performed.
Figure 2C:
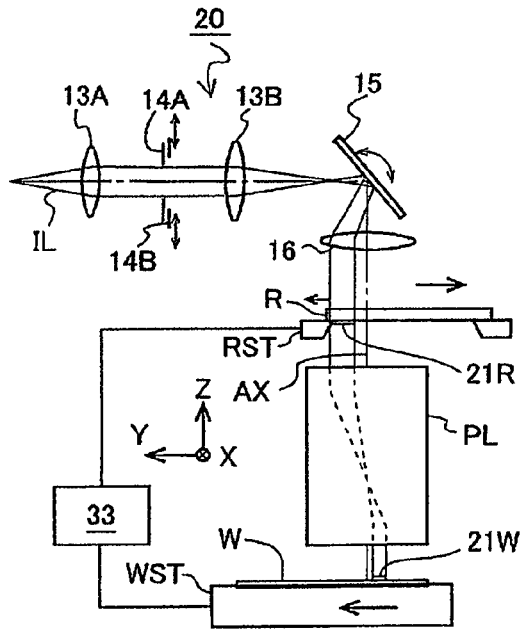
FIG. 2C shows changes in the positional relationships among an illumination area 21R, a reticle stage RST, and a wafer stage WST in FIG. 1 when a scanning exposure is performed.

The following text explains an operation that is performed when one shot region SA of the wafer is exposed with the image of the pattern of the reticle R using a scanning exposing method, referencing FIG. 2A through FIG. 2C and FIG. 3A through FIG. 3F. FIG. 2A through FIG. 2C are views that show the change in the positional relationships among the illumination area 21R, the reticle stage RST, and the wafer stage WST in FIG. 1 when a scanning exposure is performed. FIG. 3A through FIG. 3F are views that show the change in the positional relationship between the shot region SA on the wafer W and the exposure area 21W in FIG. 1 when a scanning exposure is performed.

Figure 3A:
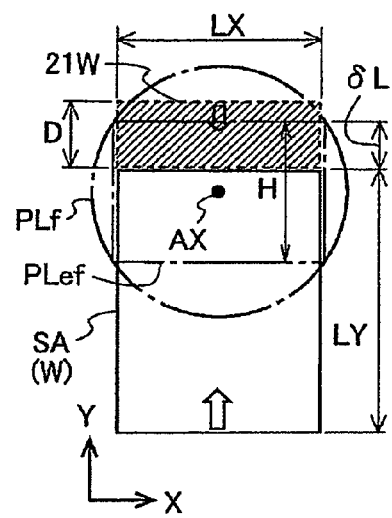
FIG. 3A shows changes in the positional relationship between a shot region SA on a wafer W and an exposure area 21W in FIG. 1 when a scanning exposure is performed.

In FIG. 3A, a visual field on the wafer side of the projection optical system PL serves as a circular visual field PLf, and a rectangular area within that visual field PLf that has a width LX in the X directions and a length H in the Y directions and wherein an image is effectively formed is the effective field PLef. The effective field PLef is inscribed in the visual field PLf. The length LX of the exposure area 21W (i.e., the area conjugate with the illumination area 21R when the exposure area is fully contained in FIG. 1) in the X directions is the same as the width of the effective field PLef, and a width (slit width) D of the exposure area 21W in the Y directions is, for example, substantially ½ of the length H of the effective field PLef.

In addition, in FIG. 2A, the scanning velocity of the illumination area 21R in the Y directions during a scanning exposure is within a range of, for example, approximately a fraction of to several fold a scanning velocity VR of the reticle stage RST (the reticle R) in the Y directions. Furthermore, in the present embodiment, a scanning direction SDI of the illumination area 21R is set to the reverse of a scanning direction SDR of the reticle R. In this case, the scanning direction of the exposure area 21W is also the reverse of a scanning direction SDW of the wafer W. Thereby, compared with the case wherein only the reticle R is scanned, the relative scanning velocity of the illumination area 21R with respect to the reticle R is greater, the exposure time is shorter, and the scanning distance of the reticle R can be shortened. The following text explains an exemplary case wherein the scanning velocity of the illumination area 21R in the Y directions is set to ½ the scanning velocity VR of the reticle R.

First, after the alignment of the reticle R and the wafer W is complete, the movement (approach) of the reticle stage RST and the wafer stage WST and the radiation of the illumination light IL to the illumination area 21R are started. Furthermore, as shown in FIG. 2A, the movement of the wafer W by the wafer stage WST with respect to the exposure area 21W in the scanning direction SDW (here, the +Y direction) at a fixed velocity β·VR (wherein β is the projection magnification) is synchronized to the movement of the reticle R by the reticle stage RST with respect to the illumination area 21R in the scanning direction SDR (here, the −Y direction) at the fixed velocity VR. Furthermore, the deflecting mirror 15 is driven in order to scan the illumination area 21R in the scanning direction SDI (here, the +Y direction) in the reticle surface at a velocity VR/2.

Figure 3B:
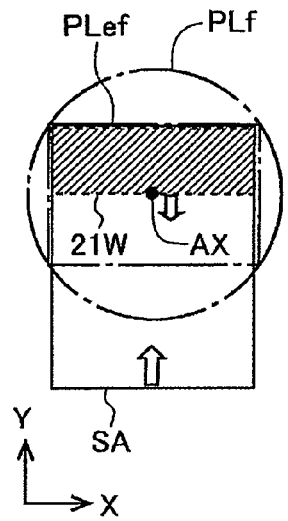
FIG. 3B shows changes in the positional relationship between a shot region SA on a wafer W and an exposure area 21W in FIG. 1 when a scanning exposure is performed.

FIG. 2A shows the state at the point in time at which the exposure of the wafer W by the illumination light IL is started. In this state, as shown in FIG. 3A, the shot region SA on the wafer W and the exposure area 21W (at this stage, the entire exposure area 21W is shielded by the movable blind 14B in FIG. 1) are positionally related so that the +Y direction end part of the shot region SA and the −Y direction end part of the exposure area contact one another, and the +Y direction end part of the shot region SA is inwardly shifted from the +Y direction end part of the effective field PLef of the projection optical system PL by δL (=2D/3). Furthermore, the shot region SA moves in the +Y direction as the exposure area 21W is scanned in the −Y direction; in addition, as shown in FIG. 3B, when the +Y direction end part of the shot region SA coincides with the +Y direction end part of the effective field PLef, the +Y direction end part of the fully contained exposure area 21W also coincides with that end part. Furthermore, the reticle R moves synchronously with the wafer W so that the image of the pattern area 22 in FIG. 1 coincides with the shot region SA.

Figure 3C:
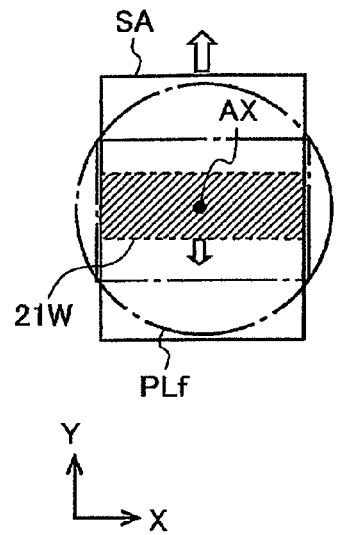
FIG. 3C shows changes in the positional relationship between a shot region SA on a wafer W and an exposure area 21W in FIG. 1 when a scanning exposure is performed.
Figure 3D:
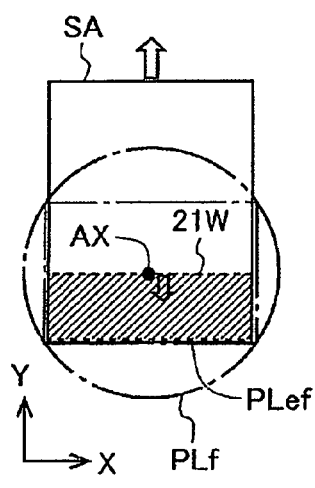
FIG. 3D shows changes in the positional relationship between a shot region SA on a wafer W and an exposure area 21W in FIG. 1 when a scanning exposure is performed.
Figure 3E:
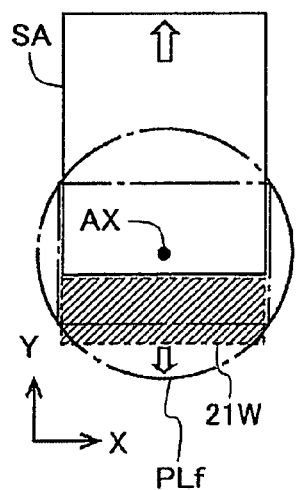
FIG. 3E shows changes in the positional relationship between a shot region SA on a wafer W and an exposure area 21W in FIG. 1 when a scanning exposure is performed.

When the exposure area 21W and the shot region SA further move from the state in FIG. 3B to the state in FIG. 3C and the corresponding FIG. 2B, the exposure area 21W is positioned at the center of the shot region SA in the Y directions. The exposure area 21W is further scanned in the −Y direction, the shot region SA further moves in the +Y direction, and, when the −Y direction end parts of the shot region SA and the exposure area 21W coincide with the −Y direction end part of the effective field PLef as shown in FIG. 3D, the portions of the exposure area 21W that jut out from those end parts are shielded by the movable blind 14B in FIG. 1. Furthermore, as shown in FIG. 3E and the corresponding FIG.

2C, when the shot region SA and the exposure area 21W are spaced apart, the exposure of the shot region SA with the image of the pattern of the reticle R ends, the deceleration of the reticle stage RST and the wafer stage WST starts, and the radiation of the illumination light IL stops.

Next, by stepping the wafer stage WST, the next shot region on the wafer W reaches the scanning start position, after which the radiation of the illumination light IL starts and, in the reverse of the state in FIG. 2A, the reticle stage RST (the reticle R) moves in the +Y direction, the wafer stage WST (the wafer W) moves in the −Y direction, and the illumination area 21R is scanned in the +Y direction; thereby, the relevant shot region is exposed with the image of the pattern of the reticle R. By combining such step-and-scan operations with the scanning of the illumination area 21R (the exposure area 21W), all of the shot regions on the wafer W are exposed with the image of the pattern of the reticle R.

Figure 3F:
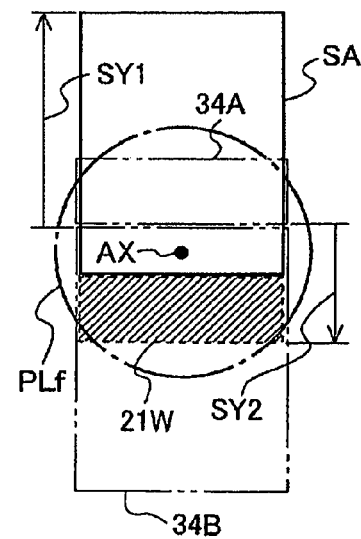
FIG. 3F shows changes in the positional relationship between a shot region SA on a wafer W and an exposure area 21W in FIG. 1 when a scanning exposure is performed.

In the present embodiment, as shown in FIG. 3F, if the scanning distance of the exposure area 21W in the Y directions from a position 34A when the exposure is started until the exposure ends is given as SY2 (substantially 5D/3), then a scanning distance SY1 (a distance that does not include acceleration and deceleration) of the shot region SA in the Y directions from a position 34B immediately after the start of exposure until immediately after the end of exposure is shorter than a length LY of the shot region SA, as shown in the equation below.

$$SY1 = LY + D - SY2 \quad (1)$$

This means that the scanning distance of the reticle stage RST is shorter than the length of the pattern area 22 of the reticle R. This ability to shorten the length of the reticle base 24 in the Y directions in FIG. 1 makes it possible to reduce the size of the stage mechanism. Furthermore, the relative scanning velocity of the illumination area 21R with respect to the reticle R is 3/2 times that of a regular scanning exposure and the scanning time is reduced to ⅔ that of a regular scanning exposure, which consequently shortens the exposure time of each shot region to substantially ⅔ that of a regular scanning exposure and improves the throughput of the exposing process.

Figure 4A:
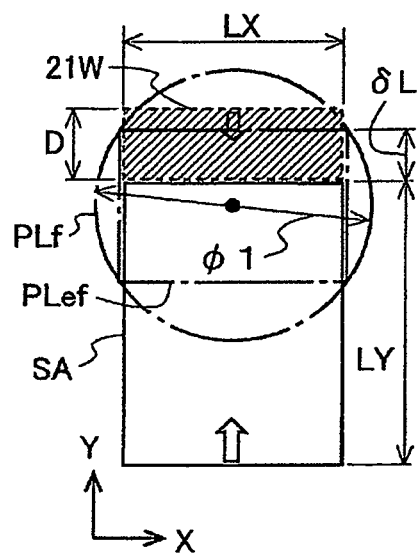
FIG. 4A includes a view for explaining a comparison between an exposing method of the abovementioned embodiment and other exposing methods.
Figure 4B:
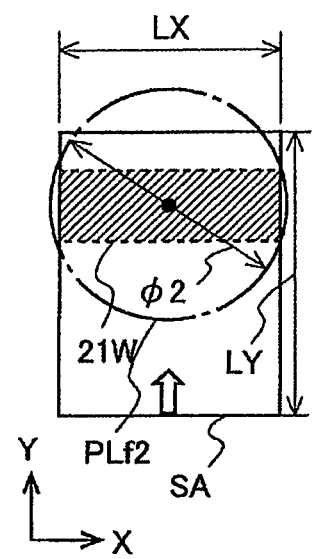
FIG. 4B includes a view for explaining a comparison between an exposing method of the abovementioned embodiment and other exposing methods.
Figure 4C:
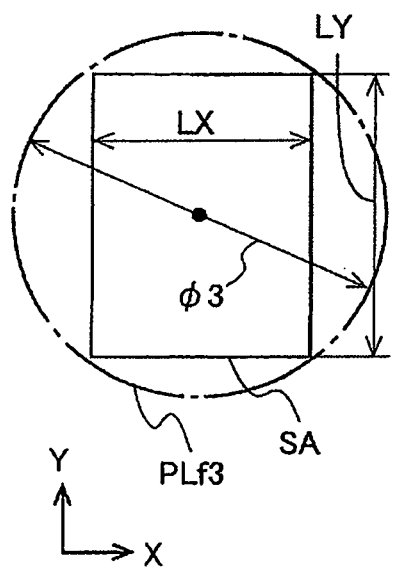
FIG. 4C includes a view for explaining a comparison between an exposing method of the abovementioned embodiment and other exposing methods.

Next, referencing FIG. 4A through FIG. 4D, which show the relationships between the shot region SA on the wafer and the exposure area 21W and the like, the exposing method of the present embodiment (as shown in FIG. 4A) will be compared with the regular scanning exposing method (as shown in FIG. 4B) and the full-field exposing method (as shown in FIG. 4C). Here, the shape of the shot region SA on the wafer is defined so that its width LX and its length LY are common to all of the exposing methods. In addition, as in the present embodiment, the exposure area 21W with the width D in the scanning direction is also used with the regular scanning exposing method. First, the diameter of the circular visual field PLf on the wafer side of the projection optical system PL in the exposing method of the present embodiment shown in FIG. 4A is given as $\phi 1$.

Next, FIG. 4B shows the regular scanning exposing method wherein the shot region SA on the wafer is scanned with respect to the stationary exposure area 21W. The diameter of a circular visual field PLf2 of the projection optical system in FIG. 4B is given as $\phi 2$. A scanning distance SY1' of the shot region SA in the regular scanning exposing method is longer than the length LY of the shot region SA, as expressed in the following equation.

$$SY1 = LY + D \quad (2)$$

By comparing the above equation with equation (1), it can be seen that, in the present embodiment, the scanning distance, compared with that of the regular scanning exposing method, is shorter by a value of SY2.

Furthermore, because the exposure area 21W is inscribed in the visual field PLf2 in FIG. 4B, the diameter $\phi 2$ is smaller than the diameter $\phi 1$ of the present embodiment in FIG. 4A. However, in one example, the width D of the exposure area 21W in the Y directions is 8 mm, the width LX in the X directions is 26 mm, and the length of the shot region SA in the Y directions is 33 mm. Furthermore, if the scanning velocity of the exposure area 21W in the reverse direction is ½ that of the scanning velocity of the wafer W in the present embodiment, then the length of the effective field PLef in the Y directions in FIG. 4A (which corresponds to the length H in FIG. 4D) is substantially 16.5 mm. Accordingly, when the diameter $\phi 2$ (substantially 27.2 mm) of the visual field PLf2 in FIG. 4B is defined as 100%, the diameter $\phi$ (substantially 30.8 mm) of the visual field PLf of the present embodiment in FIG. 4A is defined as substantially 113%. Accordingly, the visual field of the projection optical system of the present embodiment may be substantially 13% larger than the visual field of a regular scanning exposure type projection optical system.

In contrast, a visual field PLf3 of the projection optical system that uses a full-field exposing method in FIG. 4C is sized such that it inscribes the shot region SA. Accordingly, a diameter $\phi 3$ (substantially 42 mm) of the visual field PLf3 is substantially 54% larger than the visual field PLf2 of a regular scanning exposure type projection optical system.

Figure 4D:
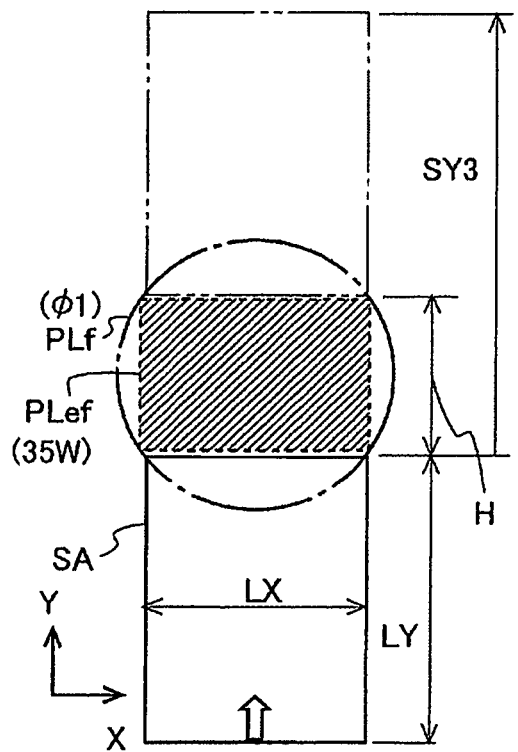
FIG. 4D includes a view for explaining a comparison between an exposing method of the abovementioned embodiment and other exposing methods.

In addition, if the entire effective field PLef in the exposing method of the present embodiment in FIG. 4A is a stationary exposure area 35W with a width H, as shown in FIG. 4D, then a scanning distance SY3 of the shot region SA when the scanning exposure is performed unfortunately becomes considerably longer, as expressed in the equation below, than the scanning distance in a regular scanning exposure type projection optical system, which, because it increases the size of the stage mechanism, is not preferable.

$$SY3 = LY + H \quad (3)$$

The operation and effects of the present embodiment are as below.

(1) The exposing method performed by the exposure apparatus 100 in FIG. 1 forms the pattern formed in the reticle R on the wafer W, wherein part of the pattern formed in the reticle R is illuminated at the rectangular illumination area 21R, and the illumination area 21R is scanned with respect to the reticle R in the Y directions, which are the short side direction (prescribed direction) of the illumination area 21R, by the deflecting mirror 15, the second condenser lens 16, and the drive part 17 (i.e., an illumination area scanning mechanism). Furthermore, during this scan, an apparatus (a control apparatus) that comprises the stage control system 33, the reticle stage RST, and the wafer stage WST moves the reticle R in the Y directions, which are parallel to the scanning direction of the illumination area 21R, and likewise moves the wafer W in the Y directions, which correspond to the movement directions of the reticle R.

According to the present embodiment, in addition to the reticle R and the wafer W being moved, the illumination area 21R (and, in turn, the exposure area 21W) is scanned. Accordingly, it is possible to reduce the amount of time needed for a single scanning exposure without increasing the velocities of the reticle R and the wafer W, which are moved by the stages RST, WST, respectively, and thereby to improve the throughput of the exposing process.

In addition, if the position of the illumination area 21R in the scanning direction changes, then the position of the exposure area 21W on the wafer W in the scanning direction undergoes a corresponding change; consequently, the positioning accuracy of the scanning of the illumination area 21R (the exposure area 21W) can be markedly relaxed (i.e., made coarser by a value of, for example, approximately 1/1000) to a greater degree than the positioning accuracy of the reticle stage RST (the wafer stage WST). Accordingly, it is possible to maintain a high degree of exposure accuracy (i.e., overlay accuracy and the like) while simultaneously increasing throughput.

(2) In addition, in the present embodiment, the scanning direction of the illumination area 21R are the reverse of the movement directions of the reticle R and, as a result, the scanning direction of the exposure area 21W are also the reverse of the movement directions of the wafer W. Thereby, the relative scanning velocity of the illumination area 21R with respect to the reticle R can be maximized (based on the sum of both of the scanning velocities), which makes it possible to further significantly increase throughput.

(3) In addition, in the present embodiment, because the illumination area 21R is scanned by pivoting the deflecting mirror 15, which is disposed in a plane conjugate with the pupillary plane of the illumination optical system 20, the illumination area 21R can be scanned with a simple mechanism; moreover, since only the illumination area 21R should be illuminated, the utilization factor of the illumination light IL is high. Furthermore, a mirror for scanning may be installed in the pupillary plane of the illumination optical system 20 or in the vicinity of that pupillary plane or its conjugate plane.

In addition, in FIG. 1, either without pivoting the deflecting mirror 15 or in parallel with the performance of the pivoting operation of the deflecting mirror 15, the fixed blind 14A (i.e., field stop) may be scanned at either a fixed or variable velocity in the short side direction of its opening in a plane that is conjugate with the reticle surface or in a plane in the vicinity of that conjugate plane. The mechanism that scans the fixed blind 14A in this manner should be provided with simply a sliding drive part; consequently, its configuration is simple. However, to perform this scanning, the entire scanning range of the fixed blind 14A must be illuminated with the illumination light IL.

(4) In addition, in the present embodiment, the projection optical system PL, which projects the image of the pattern of the reticle R within the illumination area 21W onto the wafer W, is provided and the illumination area 21R is scanned in the Y directions within the visual field of the projection optical system PL at the reticle R (in the state wherein at least part of the illumination area 21R lies in the effective field).

In this case, if the projection optical system PL is a reduction magnification system, then it is possible to relax the respective control accuracies of the positions and the velocities of both the reticle R as well as the illumination area 21R, which makes it easier to scan the illumination area 21R.

Second Embodiment

Next, a second embodiment of the present invention will be explained, referencing FIG. 5. Portions in FIG. 5 that correspond to those in FIG. 1 are assigned the identical symbols, and detailed explanations thereof are omitted.

Figure 5:
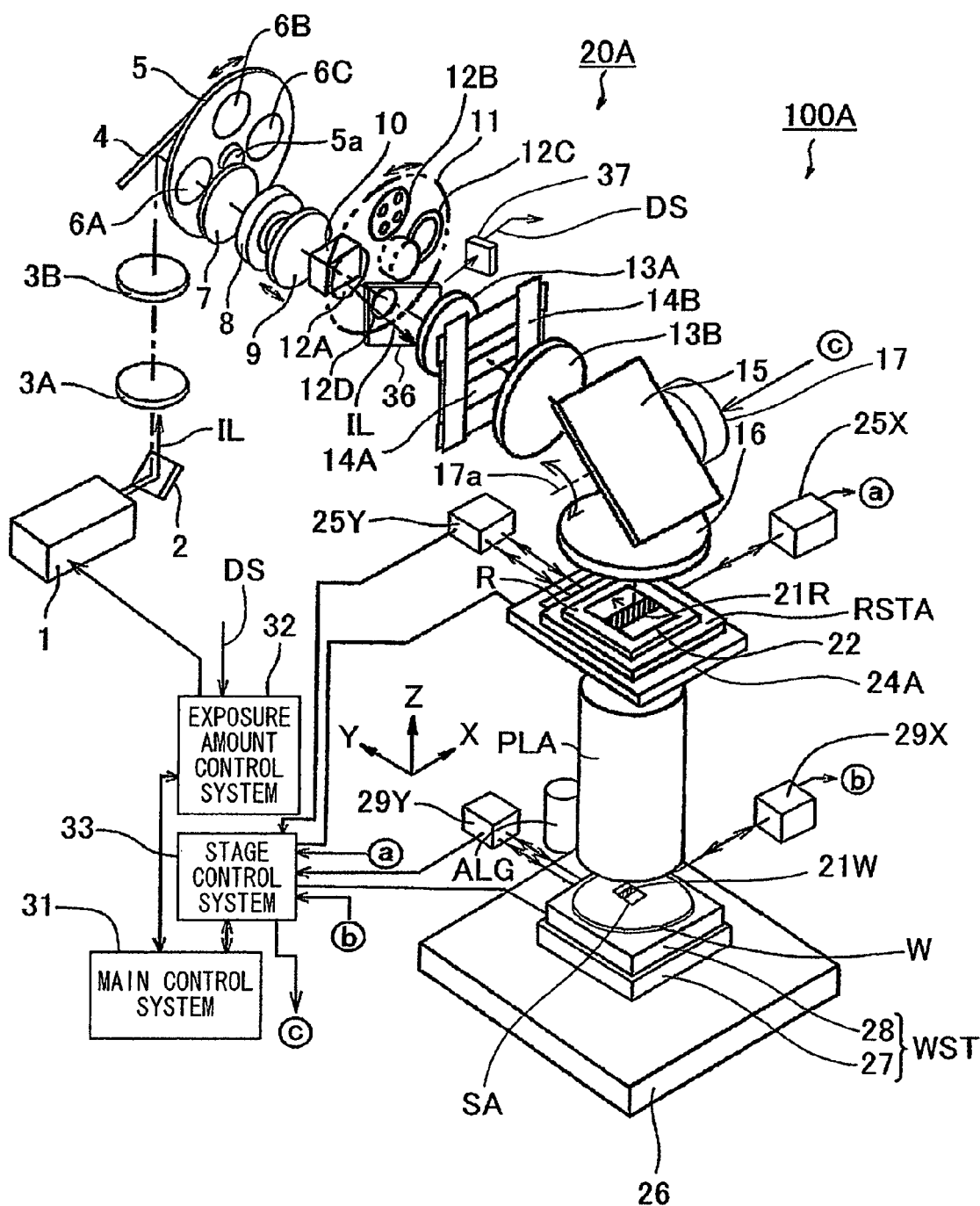
FIG. 5 is an oblique view that shows a schematic configuration of the exposure apparatus according to a second embodiment of the present invention.

FIG. 5 shows an exposure apparatus 100A of the present embodiment. In FIG. 5, a beam splitter 36, which splits part of the illumination light IL, and an integrator sensor 37, which comprises a photoelectric sensor that receives the split light beams from the beam splitter 36 via a condenser lens (not shown), are disposed inside an illumination optical system 20A of the exposure apparatus 100A. A detection signal DS of the integrator sensor 37 is supplied to the exposure amount control system 32, which indirectly monitors the luminous flux intensity of the illumination light IL on both the reticle R and the wafer W based on that detection signal DS. The monitored results are supplied to the stage control system 33 via the main control system 31. Furthermore, instead of the integrator sensor 37, for example, a photoelectric sensor disposed in the vicinity of the light source 1 may be used.

In addition, a reticle stage RSTA has a function that finely adjusts the position of the reticle R in two dimensions on a reticle base 24A. Accordingly, the reticle stage RSTA does not necessarily have a function that scans the reticle R in the Y directions. Furthermore, a projection optical system PLA has an object side visual field sufficient only for exposing the shot region SA on the wafer W with the full field of the pattern in the pattern area 22 of the reticle R. The configuration of the exposure apparatus 100A is otherwise the same as the exposure apparatus 100 in FIG. 1.

In the present embodiment, when each shot region SA on the wafer W is exposed with the pattern of the reticle R through the projection optical system PL, by pivoting the deflecting mirror 15 in the state wherein the reticle R and the wafer W are substantially stationary, the illumination area 21R illuminated by the illumination light IL is scanned in both the +Y and −Y directions over the entire surface of the pattern area 22 of the reticle R. At this time, if the sensitivity (i.e., appropriate amount of exposure) of the resist on the wafer W is given as EPH, the scanning velocity of the exposure area 21W, which is conjugate with the illumination area 21R, in the Y directions with respect to the wafer W is given as V21W, the width of the exposure area 21W in the Y directions is given as D, and the luminous flux intensity (i.e., the product of the pulse energy and the frequency) of the illumination light IL is given as PIL, then the stage control system 33 sets the scanning velocity V21W according to the following equation.

$$V21W = D \cdot PIL/EPH \tag{4}$$

Therefore, in accordance with the sensitivity EPH of the resist and the luminous flux intensity PIL of the illumination light IL (the pattern formation conditions), the scanning velocity V21W of the exposure area 21W is controlled, and, in turn, the scanning velocity of the illumination area 21R is controlled.

In addition, during the scanning of the illumination area 21R, the wafer W is moved finely in the X directions, the Y directions, and the θZ direction on the wafer stage WST side so as to both correct any magnification error and the like of the projection optical system PL in the Y directions and reduce the alignment error between the reticle R and the shot region SA on the wafer W. Thereby, each shot region of the wafer W is exposed with the image of the pattern of the reticle R with high precision.

Furthermore, as in the first embodiment, in the second embodiment the reticle stage RSTA may be provided with a function to scan the reticle R in the Y directions.

The operation and effects of the present embodiment are as below.

(1) The exposing method performed by the exposure apparatus 100A in FIG. 5 forms the pattern formed in the reticle R on the wafer W, wherein: part of the pattern formed in the reticle R is illuminated at the illumination area 21R, which is long and thin in the X directions, by the illumination light IL from the illumination optical system 20A; the illumination area 21R is scanned with respect to the reticle R in the Y directions, which are the short side direction (prescribed direction) of the illumination area 21R, by a mechanism (an illumination area scanning mechanism) that includes the deflecting mirror 15, the second condenser lens 16, and the drive part 17; and the scanning velocity of the illumination area 21R with respect to the reticle R is controlled by the stage control system 33 (control apparatus) based on the formation conditions of the relevant pattern.

Accordingly, by increasing the scanning velocity of the illumination area 21R with virtually no movement of the reticle R and the wafer W by the stages, it is possible to shorten the exposure time and improve the throughput of the exposing process. Furthermore, the scanning velocity of the illumination area 21R is controlled based on the pattern formation conditions, which makes it possible to provide the resist on the wafer W with the appropriate amount of exposure.

(2) In addition, the pattern formation conditions include information about the luminous flux intensity of the illumination light on the wafer W, and the scanning velocity of the illumination area 21R with respect to the reticle R is controlled in accordance with that illumination light luminous flux intensity information, which makes it possible to provide the wafer W with the appropriate amount of exposure even if the luminous flux intensity fluctuates.

(3) In addition, the pattern formation conditions include information about the sensitivity of the resist on the wafer W. The scanning velocity of the illumination area 21R with respect to the reticle R is controlled in accordance with that sensitivity information, which makes it possible to expose resists that have various sensitivities with the respective appropriate amounts of exposure.

(4) In addition, in the present embodiment, too, the projection optical system PL, which projects the image of the pattern of the reticle R within the illumination area 21W onto the wafer W, is provided and the illumination area 21R is scanned in the Y directions within the visual field of the projection optical system PL at the reticle R (in the state wherein at least part of the illumination area 21R lies in the effective field).

In this case, if the projection optical system PL is a reduction magnification system, then it is possible to relax the control accuracies of the position and the velocity of the illumination area 21R, which makes it easier to scan the illumination area 21R.

Third Embodiment

Next, a third embodiment of the present invention will be explained, referencing FIG. 6. Portions in FIG. 6 that correspond to those in FIG. 5 are assigned identical symbols, and detailed explanations thereof are omitted.

Figure 6:
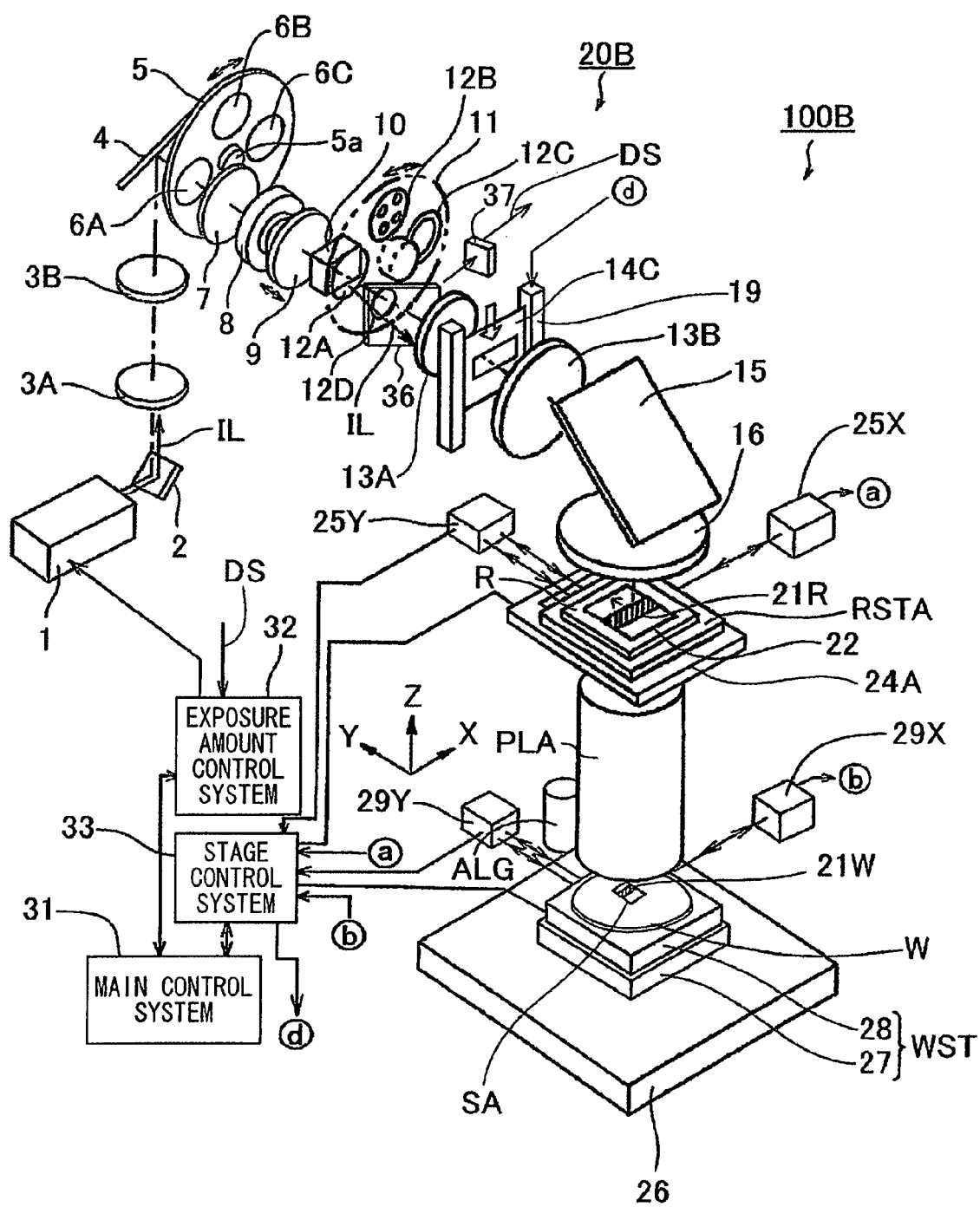
FIG. 6 is an oblique view that shows a schematic configuration of the exposure apparatus according to a third embodiment of the present invention.

FIG. 6 shows an exposure apparatus 100B of the present embodiment. In FIG. 6, a blind 14C (i.e., field stop), wherein an aperture is formed that defines the shape of the illumination area 21R on the reticle R, is disposed inside an illumination optical system 20B of the exposure apparatus 100B in a plane conjugate to the reticle surface or in the vicinity of that conjugate plane so that it is capable of moving in the short side directions of the aperture (i.e., in the directions corresponding to the Y directions on the reticle R). In addition, a drive part 19 that comprises a linear motor, which scans the blind 14C at either a fixed velocity or a velocity with a prescribed characteristic in the short side direction, and a linear encoder, is supported by the frame (not shown). The stage control system 33 controls the operation of the drive part 19. The deflecting mirror 15 of the present embodiment is fixed. The configuration of the exposure apparatus 100B is otherwise the same as that of the exposure apparatus 100A in FIG. 5.

In the present embodiment, when each shot region SA on the wafer W is exposed with the pattern of the reticle R through the projection optical system PL, by scanning the blind 14C in the state wherein the reticle R and the wafer W are substantially stationary, the illumination area 21R illuminated by the illumination light IL is scanned in both the +Y and −Y directions over the entire surface of the pattern area 22 of the reticle R. At this time, the scanning velocity V21W of the exposure area 21W, and, in turn, the scanning velocity of the illumination area 21R, is controlled based on the abovementioned equation (4). Thereby, each shot region on the wafer W is exposed with the image of the pattern of the reticle R with high precision.

Furthermore, in the embodiments of FIG. 5 and FIG. 6, too, the illumination area 21 may be scanned by combining the pivoting of the deflecting mirror 15 and the scanning of the blind 14A (or 14C).

Figure 7:
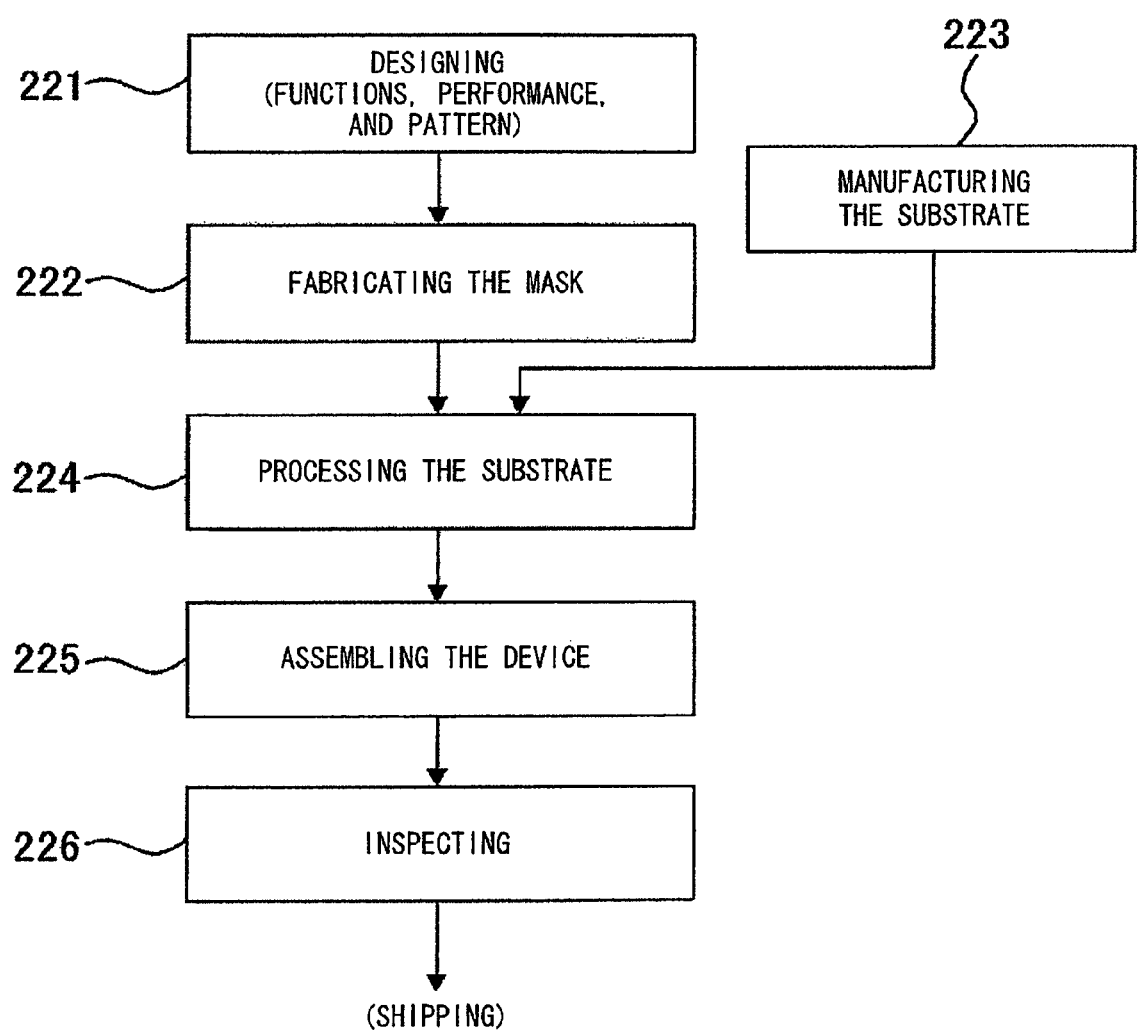
FIG. 7 is a flow chart that shows one example of a device fabricating process that uses the exposure apparatus of the abovementioned embodiments.

In addition, when a device (i.e., an electronic device or a microdevice), such as a semiconductor device, is fabricated using the exposure apparatus according to the abovementioned embodiments, it is fabricated as shown in FIG. 7 by, for example: a step 221 that designs the functions and performance of the device; a step 222 that fabricates a mask (reticle) based on the designing step; a step 223 that manufactures a substrate (wafer), which is the base material of the device; a substrate processing step 224 that includes, for example, a process that uses the exposure apparatus 100, 100A, or 100B according to the embodiments discussed above to expose the substrate with the pattern of the mask, a process that develops the exposed substrate, and a process that heats (cures) and etches the developed substrate; a device assembling step 225 (comprising fabrication processes, such as a dicing process, a bonding process, and a packaging process); and an inspecting step 226.

In other words, the abovementioned device fabricating method includes the process that exposes the wafer W using the exposure apparatus according to the abovementioned embodiments and a process that processes the exposed wafer W (step 224). According to the present device fabricating method, the stage mechanisms of the exposure apparatus can be simplified and the exposure time can be shortened, which makes it possible to fabricate semiconductor devices and the like with high throughput. Furthermore, the present invention can also be adapted to a proximity type exposure apparatus that exposes a wafer (or a glass plate or the like) with the pattern of a mask without using a projection exposure system.

In addition, the present invention can also be adapted to a liquid immersion type exposure apparatus that supplies a liquid to a space between a wafer and the front optical member of the projection optical system when an exposure is performed, as disclosed in, for example, PCT International Publication No. WO99/49504 and PCT International Publication No. WO2004/019128.

In addition, the present invention is not limited in its application to processes of fabricating semiconductor devices; for example, the present invention can be adapted widely to processes for fabricating display apparatuses, such as plasma displays or liquid crystal display devices that are formed in, for example, an angular glass plate, as well as to processes for fabricating various devices such as image capturing devices (CCDs and the like), micromachines, microelectromechanical systems (MEMS), thin film magnetic heads wherein a ceramic wafer is used as a substrate, and DNA chips. Furthermore, the present invention can also be adapted to fabrication processes that are employed when photolithography is used to fabricate masks (photomasks, reticles, and the like) wherein mask patterns of various devices are formed.

Furthermore, the present invention is not limited to the embodiments discussed above, and it is understood that variations and modifications may be effected without departing from the spirit and scope of the invention.

What is claimed is:

1. An exposing method that forms a pattern on an object corresponding to a pattern formed in a mask, the pattern formed in the mask having a length in a prescribed direction, the method comprising:
   illuminating the mask via a field stop, the field stop defining a shape of an illumination area on the mask; and
   while moving, by use of an illumination area scanning mechanism arranged at a position different from the field stop, the illumination area for illuminating the mask in the prescribed direction so as to scan the illumination area with respect to the mask in the prescribed direction, moving the mask in a direction that corresponds to the prescribed direction and moving the object in a direction that corresponds to the movement direction of the mask so as to ensure a movement distance of the mask required to form the pattern on the object is less than the length in the prescribed direction of the pattern formed in the mask.

2. An exposing method according to claim 1, wherein a scanning direction of the illumination area is a reverse of the movement direction of the mask.

3. An exposing method according to claim 1, the method further comprising:
   providing a projection optical system configured to project an image of the pattern of the mask within the illumination area onto the object; and
   scanning the illumination area within a visual field of the projection optical system at the mask in the prescribed direction.

4. An exposing method according to claim 3, wherein a scanning velocity of the illumination area is controlled based on a formation condition of the pattern, which is to be formed on the object.

5. An exposing method according to claim 4, wherein the formation condition includes luminous flux intensity information regarding an illumination light on the object; and
   the scanning velocity of the illumination area with respect to the mask is controlled in accordance with the luminous flux intensity information of the illumination light.

6. An exposing method according to claim 4, wherein the object is a substrate that is coated with a photosensitive material;
   the formation condition of the pattern includes sensitivity information about the substrate; and
   the scanning velocity of the illumination area with respect to the mask is controlled in accordance with the sensitivity information regarding the substrate.

7. An exposing method according to claim 3, the method further comprising:
   scanning the illumination area within the visual field of the projection optical system at the mask in the prescribed direction; and
   moving the object in a direction that corresponds to the prescribed direction in accordance with an image forming performance of the projection optical system.

8. A device fabricating method, the method comprising:
   exposing a substrate using an exposure method according to claim 1; and
   processing the exposed substrate.

9. An exposing method that forms a pattern on an object corresponding to a pattern formed in a mask, the pattern formed in the mask having a length in a prescribed direction, the method comprising:
   illuminating the mask via a field stop, the field stop defining a shape of an illumination area of the mask;
   moving, by use of an illumination area scanning mechanism arranged at a position different from the field stop, the illumination area for illuminating the mask in the prescribed direction so as to scan the illumination area with respect to the mask in the prescribed direction and so as to ensure a movement distance of the mask required to form the pattern on the object is less than the length in the prescribed direction of the pattern formed in the mask; and
   based on a formation condition of the pattern, controlling a scanning velocity of the illumination area with respect to the mask.

10. An exposing method according to claim 9, wherein the formation condition of the pattern includes luminous flux intensity information regarding an illumination light on the object; and
    the scanning velocity of the illumination area with respect to the mask is controlled in accordance with the luminous flux intensity information of the illumination light.

11. An exposing method according to claim 9, wherein the object is a substrate that is coated with a photosensitive material;
    the formation condition of the pattern includes sensitivity information about the substrate; and
    the scanning velocity of the illumination area with respect to the mask is controlled in accordance with the sensitivity information regarding the substrate.

12. An exposing method according to claim 9, the method further comprising:
    providing a projection optical system configured to project an image of part of the pattern of the mask within the illumination area onto the object; and
    scanning the illumination area within a visual field of the projection optical system at the mask in the prescribed direction; and
    moving the object in a direction that corresponds to the prescribed direction in accordance with an image forming performance of the projection optical system.

13. An exposing method according to claim 9, the method further comprising:
    while scanning the illumination area with respect to the mask in the prescribed direction, moving the mask in the direction corresponding to the prescribed direction and moving the object in a direction corresponding to a movement direction of the mask.

14. A device fabricating method, the method comprising:
    exposing a substrate using an exposure method according to claim 9; and
    processing the exposed substrate.

15. An exposure apparatus configured to form a pattern on an object corresponding to a pattern formed in a mask, the pattern formed in the mask having a length in a prescribed direction, the exposure apparatus comprising:
    an illumination optical system that has a field stop and that is configured to illuminate the mask, the field stop defining a shape of an illumination area on the mask;
    an illumination area scanning mechanism that is arranged at a position different from the field stop and that is configured to move the illumination area for illuminating the mask in the prescribed direction so as to scan the illumination area with respect to the mask in the prescribed direction; and a control apparatus configured to move, while scanning the illumination area with respect to the mask in the prescribed direction, the mask in a direction corresponding to the prescribed direction and configured to move the object in a direction corresponding to the movement direction of the mask so as to ensure a movement distance of the mask required to form the pattern on the object is less than the length in the prescribed direction of the pattern formed in the mask.

16. An exposure apparatus according to claim 15, wherein the control apparatus is configured to move the mask in a direction that is a reverse of a scanning direction of the illumination area.

17. An exposure apparatus according to claim 15, wherein the illumination area scanning mechanism comprises:

a minor disposed in a pupillary plane of the illumination optical system, a plane conjugate with the pupillary plane, or a plane in a vicinity of the pupillary plane or the conjugate plane; and a minor drive part configured to pivot the minor around an axis that is parallel to a direction corresponding to a direction orthogonal to the prescribed direction.

18. An exposure apparatus according to claim 17, wherein the illumination area scanning mechanism comprises an f·θ lens system configured to guide an exposure light reflected by the mirror to the illumination area.

19. An exposure apparatus according to claim 15, wherein the field stop is disposed in a plane conjugate to the pattern surface of the mask or a plane in a vicinity of the conjugate plane.

20. An exposure apparatus according to claim 15, the apparatus further comprising:

a projection optical system configured to project an image of part of the pattern of the mask within the illumination area onto the object;

wherein, the illumination area scanning mechanism is configured to scan the illumination area within a visual field of the projection optical system at the mask in the prescribed direction.

21. A device fabricating method, the method comprising:
exposing a substrate using an exposure apparatus according to claim 15; and
processing the exposed substrate.

22. An exposure apparatus configured to form a pattern on an object corresponding a pattern formed in a mask, the pattern formed in the mask having a length in a prescribed direction, the exposure apparatus comprising:

an illumination optical system that has a field stop and that is configured to illuminate the mask, the field stop defining a shape of an illumination area on the mask;

an illumination area scanning mechanism that is arranged at a position different from the field stop and that is configured to move the illumination area for illuminating the mask in the prescribed direction so as to scan the illumination area with respect to the mask in the prescribed direction and so as to ensure a movement distance of the mask required to form the pattern on the object is less than the length in the prescribed direction of the pattern formed in the mask; and a control apparatus configured to control a scanning velocity of the illumination area with respect to the mask based on a formation condition of the pattern.

23. An exposure apparatus according to claim 22, wherein the formation condition of the pattern includes luminous flux intensity information regarding an illumination light on the object;

a luminous flux intensity sensor is provided that is configured to measure the luminous flux intensity information regarding the illumination light; and the illumination area scanning mechanism is configured to control the scanning velocity of the illumination area with respect to the mask in accordance with the information regarding the luminous flux intensity as measured by the luminous flux intensity sensor.

24. An exposure apparatus according to claim 22, wherein the object is a substrate that is coated with a photosensitive material;

the formation condition of the pattern includes sensitivity information regarding the substrate; and the illumination area scanning mechanism is configured to control the scanning velocity of the illumination area with respect to the mask in accordance with the sensitivity information regarding the substrate.

25. An exposure apparatus according to claim 22, the apparatus further comprising:

a projection optical system configured to project an image of part of the pattern of the mask in the illumination area onto the object;

wherein, the control apparatus is configured to move the object in a direction that corresponds to the prescribed direction in accordance with an image forming performance of the projection optical system; and the illumination area scanning mechanism is configured to scan the illumination area within a visual field of the projection optical system at the mask in the prescribed direction.

26. An exposure apparatus according to claim 22, wherein while scanning the illumination area with respect to the mask in the prescribed direction, the control apparatus is configured to move the mask in a direction that corresponds to the prescribed direction and is configured to move the object in a direction that corresponds to a movement direction of the mask.

27. A device fabricating method, the method comprising:
exposing a substrate using an exposure apparatus according to claim 22; and
processing the exposed substrate.

* * * * *

UNITED STATES PATENT AND TRADEMARK OFFICE
CERTIFICATE OF CORRECTION

| | | |
|---|---|---|
| PATENT NO. | : 8,436,981 B2 | Page 1 of 1 |
| APPLICATION NO. | : 12/318761 | |
| DATED | : May 7, 2013 | |
| INVENTOR(S) | : Ebihara | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 829 days.

Signed and Sealed this
Nineteenth Day of April, 2016

Michelle K. Lee
*Director of the United States Patent and Trademark Office*